United States Patent [19]

Kodama et al.

[11] Patent Number: 5,045,922
[45] Date of Patent: Sep. 3, 1991

[54] INSTALLATION STRUCTURE OF INTEGRATED CIRCUIT DEVICES

[75] Inventors: Hironori Kodama; Satoru Ogihara; Hideo Arakawa, all of Hitachi; Hirokazu Inoue, Ibaraki; Yoshiyuki Yasutomi, Katsuta; Tadahiko Miyoshi, Hitachi, all of Japan

[73] Assignee: Hitachi, Ltd., Tokyo, Japan

[21] Appl. No.: 583,144

[22] Filed: Sep. 17, 1990

[30] Foreign Application Priority Data

Sep. 20, 1989 [JP] Japan .................................. 1-242036

[51] Int. Cl.$^5$ ...................... H01L 23/12; H01L 23/14
[52] U.S. Cl. ........................................ 357/75; 357/80; 357/81; 357/74
[58] Field of Search ........................ 357/75, 80, 74, 81

[56] References Cited

U.S. PATENT DOCUMENTS

| 4,908,696 | 3/1990 | Ishihara et al. | 357/80 |
| 4,930,002 | 5/1990 | Takenaka et al. | 357/75 |

FOREIGN PATENT DOCUMENTS

| 58-43553 | 3/1983 | Japan | 357/75 |
| 61-2923383 | 12/1986 | Japan | . |
| 62-93961 | 4/1987 | Japan | . |
| 62-821453 | 12/1987 | Japan | 357/75 |
| 63-198365 | 8/1988 | Japan | . |

Primary Examiner—Rolf Hille
Assistant Examiner—Sheila V. Clark
Attorney, Agent, or Firm—Antonelli, Terry, Stout & Kraus

[57] ABSTRACT

An installation structure of integrated circuit devices, in which two or more types of integrated circuit devices of different base materials are installed onto the same installation substrate. Since the installation structure has a construction according to different characteristics such as a thermal conductivity, heat generation amount, thermal expansion coefficient and the like of the integrated circuit devices made of different materials, the reliability of each device and its connection and the reduction of the costs required for the cooling method can be presented.

9 Claims, 5 Drawing Sheets

INSTALLATION STRUCTURE OF INTEGRATED CIRCUIT DEVICES

BACKGROUND OF THE INVENTION

1. Field of the Invention

The present invention relates to an installation structure of integrated circuit devices and, more particularly, to an installation structure in which two or more types of integrated circuit devices of different base materials are installed on a same substrate and a high reliability of each device and a cheap cooling method can be realized.

2. Description of the Related Art

To improve a calculating speed of a large scale computer, it is significant to achieve not only a large scale integration and a high processing speed of integrated circuit devices but also reduction in wiring length due to the installation with a high reliability and a high density, and the like. To realize these achievements, it is necessary to solve various problems which occur due to an increase in the size of integrated circuit device, an increase in number of connection points, an increase in heat generation amount, and the like. Various types of connecting methods of integrated circuit device, package/module structures, cooling methods, and the like have been examined. On the other hand, to realize a high processing speed of the integrated circuit device, in addition to the improvement of the conventional Si semiconductor device, the studies and developments of the GaAs device, superconductive device, and the like have vigorously been carried out and it has been determined that the GaAs devices have excellent characteristics over the characteristics of the Si semiconductor device from viewpoints of the operating speed and the electric power consumption. However, at the present time point, since GaAs devices are inferior to the Si device with respect to production technology, costs, and the like, they are not yet widely put into practical use.

JP-A-62-93961 discloses a method installing both of an Si device and a GaAs device onto a mullite substrate, and JP-A-61-292383 discloses a method whereby an installation density is improved by installing a GaAs device onto an Si device.

SUMMARY OF THE INVENTION

To further improve the performances of a large scale computer, an electronic apparatus, and the like in which a high processing speed will be required in future, it is an important technique that not only the Si semiconductor device is improved but also the various kinds of integrated circuit devices which can operate at a high speed as mentioned above are widely used and merits of each type of devices are combined to the best advantages. However, when the device materials are different, the thermal conductivities and the heat capacities of the materials largely differ. Therefore, in the case where the heat generated in the LSI forming portion of the chips is cooled by the same cooling method through the chips, which are general at present, a cooling efficiency of the LSI chip made of the material with a small thermal conductivity becomes worse than that of the LSI chip made of the material with a large thermal conductivity. On the other hand, in general, since all of the circuits in the integrated circuit device do not always operate, the heat generation amounts of the operating portion differ from that of the portion which does not operate. Therefore, if the thermal conductivity of the device is low, a temperature variation in the device becomes large thereby resulting in a large thermal stress being generated in the chip. As mentioned above, if a part of the conventional Si device is merely directly replaced by another device of different materials, temperatures of devices in the operating mode largely differ or a temperature variation in each device becomes large, so that a problem occurs in terms of the reliability of the device. On the other hand, to realize the reduction of wiring length for the high density installation, it is an inevitable technique to closely install the various type of integrated circuit devices onto the same substrate. However, in this case, since a heat balance becomes worse when it is seen from the whole installation structure, a problem also occurs with respect to the reliability as a whole installation structure. As a simple method of coping with the above problems, there is considered a method whereby the optimum cooling method is selected every kind of device, a method whereby a cooling structure of a high performance which can cope with the device which exhibits the highest temperature increase is used, or the like. However, if those methods are used, the cooling structure becomes complicated and expensive.

When the Si device and GaAs device are installed onto the mullite substrate, previously mentioned, thermal expansion coefficient of the installation substrate results in the intermediate value between the thermal expansion coefficients of those devices. However, the various problems regarding a thermal stress and others cannot be solved by using such a simple method. On the other hand, even in an example in which the GaAs device is installed onto the Si device, a problem of the stress due to differences between the thermal expansion coefficients and between the heat generation amounts of both of the Si device and the GaAs device occurs.

An object of the invention is to provide an installation structure of integrated circuit devices wherein, when a plurality of semiconductor devices of different materials are installed onto the same substrate, a thermal stress which acts on each device can be minimized.

Another object of this invention is to provide the installation structure of integrated circuit devices wherein when a plurality of integrated circuit devices of different materials are installed onto the same substrate, the temperature difference between the devices can be reduced, in other words, a heat balance of whole installation structure can be improved.

To accomplish the above objects, the invention provides an installation structure of integrated circuit devices, in which a plurality of integrated circuit devices of different base materials are installed in parallel onto a substrate formed with wirings, wherein thermal conductivities and thermal expansion coefficients of the different materials of the integrated circuit devices are respectively mutually different, at least one of the wiring densities, the heat generation amounts per unit area, and the sizes of the integrated circuit devices different, and at least one of the following conditions (a) to (d) are satisfied.

(a) A wiring density of the integrated circuit device made of the material having the larger thermal conductivity is higher than a wiring density of the integrated circuit device made of the material having the smaller thermal conductivity than the thermal conductivity of the said material having the larger thermal conductivity.

(b) A heat generation amount per unit area of the integrated circuit device made of the material having the larger thermal conductivity is larger than a heat generation amount per unit area of the integrated circuit device made of the material having the smaller heat conductivity than the thermal conductivity of the said material of the larger thermal conductivity.

(c) A thermal expansion coefficient of the substrate is closer to a thermal expansion coefficient of the integrated circuit device of the largest size in the whole integrated circuit device group than the thermal expansion coefficient of other integrated circuit device groups of different materials.

(d) With respect to the junctions between the board and the integrated circuit devices, more flexible structure such that a stress of a joined portion can be reduced is used for the integrated circuit device of a larger size than for the integrated circuit device of the smaller size, and as a particularly preferred example, the integrated circuit device of the larger size is joined by flexible materials and the device of the smallest size is directly joined by soldering.

On the other hand, the invention provides an installation structure of integrated circuit devices in which a plurality of integrated circuit devices of different base materials are installed onto a carrier substrate (small substrate) and a plurality of said carrier substrates or, if necessary, packages in which the above devices on carrier substrates are air-tightly sealed by caps are installed in parallel onto a multilayer circuit board (multilayer substrate), wherein thermal conductivities and thermal expansion coefficients of the different materials of the integrated circuit devices are respectively different, at least one of the wiring densities, heat generation amounts per unit area, and sizes of the integrated circuit devices are different, the installation structure has cooling means for directly cooling the said packages and the multilayer circuit board by a gas or liquid coolant if needed, and at least one of the following conditions (a) to (h) is satisfied.

(a) A wiring density of the integrated circuit device made of the material having the larger thermal conductivity is higher than a wiring density of the integrated circuit device made of the material having the smaller thermal conductivity than the thermal conductivity of the said material of the larger thermal conductivity.

(b) A heat generation amount per unit area of the integrated circuit device made of the material having the larger thermal conductivity is larger than a heat generation amount per unit area of the integrated circuit device made of the material having the smaller thermal conductivity than the thermal conductivity of the said material of the larger thermal conductivity.

(c) A thermal expansion coefficient of the multilayer substrate is closer to the thermal expansion coefficient of the integrated circuit device of the largest size in the integrated circuit device group than the thermal expansion coefficient of other integrated circuit device groups of different materials.

(d) A thermal expansion coefficient of the carrier substrate is closer to the thermal expansion coefficient of the integrated circuit device of the largest size in the integrated circuit device group than the thermal expansion coefficient of other integrated circuit device groups of different materials.

(e) A thermal expansion coefficient of the multilayer circuit board is closer to the thermal expansion coefficient of the carrier substrate of the largest size than the thermal expansion coefficient of the other carrier substrates of different materials.

(f) With respect to the junctions between the multilayer substrate and carrier substrates, more flexible structure such that a stress of a joined portion can be reduced is used for the carrier substrate carrying the integrated circuit device of the larger size than for the carrier substrate carrying the integrated circuit device of the smaller size.

(g) With respect to the junctions between the carrier substrate and the integrated circuit devices, more flexible structure such that a stress of a joined portion can be reduced is used for the integrated circuit device of the larger size than for the integrated circuit device of the smaller size.

(h) With respect to the junctions between the multilayer circuit board and the carrier substrate, more flexible structure such that a stress of a joined portion can be reduced is used for the carrier substrate of the larger size than for the carrier substrate of the smaller size.

Further, the invention provides an installation structure of integrated circuit devices in which logic devices made of Si and memory devices made of GaAs are installed in parallel onto a substrate formed with wirings, wherein a size of logic device is larger than a size of memory device and a thermal expansion coefficient of the substrate is closer to the thermal expansion coefficient of Si than that of GaAs.

According to the invention which can provide the structures as mentioned above, a higher integration degree and higher packaging density, can be accomplish and the operating processes can be executed at a high speed.

The heat generation amount per unit area of the LSI chip is proportional to the number of gates (circuits) formed per unit area or the wiring density. Contrarily speaking, the heat generation amount per unit area of the LSI chip can be easily controlled by controlling the number of gates formed per unit area of the LSI chip. Therefore, if the number of gates formed per unit area of the LSI chip made of the material having a larger thermal conductivity is set to be larger than that of the LSI chip made of the material having a smaller thermal conductivity, a temperature difference among the devices of different materials can be easily reduced. On the other hand, a temperature deviation in the device which particularly becomes a problem in the LSI chip made of the material of a small thermal conductivity can be also reduced by decreasing the number of gates formed per unit area because the heat generation amount itself of each portion decreases. Further if the most suitable number of gates per unit area for each device is selected considering the kinds, operation frequencies and arrangement of the devices, cooling structure, and the like the high reliability of the operation of each integrated circuit device can be relatively easily assured even if the conventional cooling structure is directly used without using such a complicated expensive cooling structure as mentioned above.

In the installation structure of integrated circuit devices of the invention, it is preferable to construct in a manner such that each integrated circuit device has a size which is equal to or larger than a square of 5 mm and the wiring density of the device having a larger thermal conductivity is set to be higher than the wiring density of the device having a smaller thermal conductivity at the rate of 0.5 to 2.0 gates/mm² per 1 W/m.°K of the thermal conductivity difference between the above device and the device of a smaller thermal conductivity than that of the above device, or the wiring density of the device having a larger thermal conductivity is set to be higher than the wiring density of the device having smaller thermal conductivity by an amount of 0.5 to 2.0% of the wiring density of the device having the smaller thermal conductivity at a time per 1 W/m.°K of the thermal conductivity difference between the devices of a larger thermal conductivity and a smaller thermal conductivity. Particularly, it is desirable to set the wiring density of the device of the larger thermal conductivity to be higher than that of the device of the smaller thermal conductivity by an amount of 0.7 to 1.5 gates/mm² or 0.7 to 1.5%.

Further, in the installation structure of the invention, it is preferable each integrated circuit device has a size which is equal to or larger than a square of 5 mm and the heat generation amount of the device having a larger thermal conductivity is set to be higher than the heat generation amount of the device having a smaller thermal conductivity by an amount of 0.001 to 0.02 W/mm² per 1 W/m.°K of the thermal conductivity difference between the above device and the device having a smaller thermal conductivity than the thermal conductivity of the above device. Particularly, it is desirable to set the heat generation amount of the device of the larger thermal conductivity to be higher than that of the device of the smaller thermal conductivity by an amount of 0.002 to 0.01 W/mm².

Further, by changing the dimensions of the LSI chips of different materials, it is also possible to easily cope with the requirements for achieving different performances of various systems using the installation structure of the invention. For instance, in the case where the same degree of integration per chip, that is, the total number of circuits which are formed in one chip is preferable for the devices of different materials, it is sufficient to enlarge the size of the LSI chip made of the material of the smaller thermal conductivity, that is, the LSI chip of the smaller number of circuits formed per unit area. On the other hand, in the case where it is particularly important to decrease a temperature distribution (variation) in the LSI chip and to reduce a thermal stress which is generated in the chip due to the restrictions regarding the characteristics of the LSI circuits which are formed or the strengths of the base materials which construct the LSI chips and the like, it is sufficient to decrease the number of gates formed per unit area of the LSI chip made of the material having the smaller thermal conductivity and to reduce the size of such a chip.

Further, in the case of installing two or more types of LSI chips of different base materials onto the same substrate, since various LSI chips have different thermal expansion coefficients, it is also important to control the stresses which are generated due to the thermal expansion coefficient differences between the devices and the substrate at a moderate value and to assure the reliability of the connection between the devices and the substrate. To assure the connection reliability as well, the method of changing the dimensions (maximum length) of the devices every device is the simplest and very effective method which can also solve the foregoing problems. That is, if the thermal expansion coefficient of the substrate onto which a plurality of LSI chips of different materials are installed is selected to a value which is closer to the thermal expansion coefficient of the chip of the larger size, the stresses which are generated in the device and/or in the joined portion between the device and the substrate can be suppressed to small values with respect to each device. On the other hand, in an installation structure of integrated circuit devices in which two or more types of LSI chips of different materials are installed on the small carrier substrate and the carrier substrates or a package structure installing such LSI chips, are installed onto a large substrate, the stresses which are generated in the device or in the joined portions between the device and the small substrate and/or between the large substrate and the small substrate or the package structure can be suppressed by selecting the thermal expansion coefficient of the large substrate to be closer to the thermal expansion coefficient of the LSI chip whose maximum dimension (length) is larger, or by selecting the thermal expansion coefficient of the small carrier substrate or the substrate for package structure to be closer to the thermal expansion coefficient of the LSI chip whose maximum dimension (length) is larger, or by selecting the thermal expansion coefficient of the large substrate to be closer to the thermal expansion coefficient of the small substrate or the substrate for package structure whose maximum dimension (length) is larger.

It is preferable to construct the installation structure of the invention such that an integrated circuit device has a size which is equal to or larger than a square of 5 mm and when a difference of the chip size between the largest chips and for the side length smallest chip is 1 mm, the thermal expansion coefficient of the substrate onto which the said integrated circuit devices chips are installed is set such that a difference between the thermal expansion coefficient of such a substrate and the thermal expansion coefficient of the device of the largest size is equal to or less than $10 \times 10^{-7}/°K$, and such a difference between the thermal expansion coefficients is decreased by $\frac{1}{2}$ or less each time the difference between the chip sizes is increased by 1 mm of the side length. For instance, if the chip size difference is equal to 2 mm of the side length, it is desirable to use the substrate having a thermal expansion coefficient difference of $5 \times 10^{-7}/°K$ or less from the thermal expansion coefficient of the chip of the largest size. In the case of 3 mm of the side length difference, it is desirable to use the substrate having a thermal expansion coefficient difference of $2.5 \times 10^{-7}/°K$ or less. In the case of 4 mm of the side length difference, it is preferable to use the substrate having a thermal expansion coefficient difference of $1.25 \times 10^{-7}/°K$ or less. More preferably, the thermal expansion coefficient difference is set to be $8 \times 10^{-7}/°K$ or less for the size difference of 1 mm of the side length.

The above method is effective for the case of using either one of the C4 (Controlled Collapse Chip Connection), TAB (Tape Automated Bonding), wire bonding, solder ball, micro lead and/or pin method, and the like as a connecting method between the devices and the substrate onto which they are installed, between the device and the small substrate or the package structure onto in which the device is installed, and between the small substrate or the package structure and the large substrate onto which they are installed. Further, in the installation structure of integrated circuit devices in which two or more types of LSI chips of different materials are connected onto the same substrate by the C4 method, or the LSI chips of different materials are connected to the small substrate or to the package structure onto/in which they are installed by the C4 method and they are connected to the same large substrate, by considering the size using the maximum distance (length) between the solder bumps which are formed in the connecting portions on the devices, the stresses which are generated in each LSI chip itself and/or the solder bump joining portions between the LSI chips and the substrate can be controlled within a range such that the connection reliability can be held. Similarly, even in the installation structure of integrated circuit devices in which the small substrate or the package structure onto-/in which the LSI chip is installed and the large substrate onto which the small substrate and the package structure are installed and/or the LSI chip and a substrate onto which it is directly installed are connected by solder balls, micro leads, and/or pin method, the similar method can be also applied by using the maximum distance (length) between the solder balls, micro leads, and/or connecting pins which are formed on each small substrate, package structure, or LSI chip. The stress which is generated in each joined portion can be controlled. The high connection reliability can be relatively easily assured.

Further, in the case where it is necessary to assure the higher reliability in the operation and connection due to the very severe use conditions, limitations on installation, and the like, it is also very effective means to change an installing method (connecting method) of the LSI chips made of different materials onto the substrate onto which they are directly installed or to change an installing method (connecting method) of the small substrate or package structure onto the large substrate every small substrate or every package structure onto-/in which the LSI chips made of different materials are installed. Generally, the LSI chip is mainly cooled from the side opposite to the surface on which the device or circuits was formed. However, the heat can be also obviously removed from the portion where the electrical connection was formed such as wires in the wire bonding method, tape formed with wires in the TAB method, solder bumps in the C4 method, or the like. Therefore, by selecting various different kinds of methods such as C4, TAB, wire bonding, solder balls, micro leads, pin method, etc. as a method of installing the LSI chip, the heat which is directly removed from the device forming side of the LSI chip can be controlled. For instance, in the case of realizing an apparatus with a very high performance by using the installation structure of the invention, more stable control of the LSI temperature is required, and it is considered that the limitation occurs for the method of controlling the heat generation amount itself per unit area by controlling the number of gates formed per unit area of the LSI chip while satisfying the requirement on installation and setting of the LSI. However, in such a case, if the LSI chip made of the material having a smaller thermal conductivity is connected by a method of a larger thermal conducting capability than that of the connection of the other LSI chip made of the material having a larger thermal conductivity, a larger amount of heat can be also directly removed from the surface on which the device was formed. Thus, a good heat balance among the devices can be held. Further, in the case of installing two or more types of LSI chips of different materials onto the same substrate, the above method is also effective to a purpose to reduce the stress which is generated due to the thermal expansion coefficient difference between the LSI chip and the substrate and it is compatible with the foregoing solutions of the other problems. The above method of changing the installing method (connecting method) also includes a method of changing the type of solder materials in the case of the method such as C4, solder balls, or the like whereby the connection is mainly performed by using a solder, a method of changing the type of metal in the case of connecting by the TAB, wire bonding, micro leads, pin method, or the like, etc. Practically speaking, as materials which are used to connect between the LSI chip and the substrate onto which it is directly installed and between the small substrate or the package structure on/in which the LSI chip was installed and the large substrate on which the small substrate and the package structure are installed, it is desirable to use the materials having a small rigidity in the case where the connection which can largely lighten the stress is demanded in accordance with the application use of the installation structure of integrated circuit devices.

In the installation structure of integrated circuit devices of the invention, it is preferable to have a structure such that an integrated circuit device has a size which is equal to or larger than a square of 5 mm and in the case where the chip size is equal to a square of 5 mm, and the difference between the thermal expansion coefficient of the substrate on which the device is installed and the thermal expansion coefficient of the above integrated circuit device is equal to or larger than $20 \times 10^{-7}/°K$, with the device being installed onto the substrate by using a flexible member, and, where the device size is larger than a square of 5 mm and the thermal expansion coefficient difference between the substrate and device is equal to or larger than a value which is obtained by subtracting $2.5 \times 10^{-7}/°K$ from the above thermal expansion coefficient different ($20 \times 10^{-7}/°K$), each time the device size increases by 1 mm of the side length from a square of 5 mm, the device is installed and joined onto the substrate by using a flexible members, and to directly join the devices having thermal expansion coefficient differences which are lower than those values to the substrate by soldering. For instance, for the chip size of the 10 mm square, when the thermal expansion coefficient difference is equal to or larger than $10 \times 10^{-7}/°K$, it is desirable to join by flexible members such as pins or the like. If it is equal to or less than $9 \times 10^{-7}/°K$, it is preferable to join by the C4 method. It is preferable to use metallic pins, metallic coil springs, or the like as flexible members.

In the invention, various types of devices such as Si, compound semiconductor of, GaAs, InP, HEMT, or the like, Josephson, photo device, and the like can be used as integrated circuit devices. On the other hand, the integrated circuit devices can be formed on the base of the same material as the fundamental material constructing the integrated circuit devices or can be also formed on the base of different material. That is, as a structure of the LSI chip in the invention, it is possible to use any one of the Si semiconductor device formed on the Si board, GaAs semiconductor device and HEMT device formed on the GaAs board, InP semiconductor device formed on the InP board, etc., and further, the GaAs semiconductor device, HEMT device, Josephson junction device, and photo device formed on the Si board, InP semiconductor device, Josephson device, and photo device formed on the GaAs board, GaAs semiconductor device, HEMT device, Josephson junction device, and photo device formed on the sapphire board, and the like. Any one of the logic LSI and the memory LSI can be used as an integrated circuit device in the invention. The integrated circuit devices may be also separately used as a logic LSI and a memory LSI every LSI chip of different material or they can be also used without distinguishing those application uses. Further, it is also possible to use a semiconductor circuit device such that both of the logic section and the memory section are provided in one LSI chip. For example, in the case where a plurality of Si devices and GaAs devices are installed onto the same substrate and used, each of the Si devices can be used as a logic or memory LSI and each of the GaAs devices may be also used as a memory or logic LSI. On the other hand, both of the Si devices and the GaAs devices can also construct the logic LSIs and memory LSIs, respectively.

As a substrate on which LSI chips are directly installed and/or a large substrate on which a small substrate or a package structure on/in which an LSI chip was installed is installed, it is possible to use various types of substrates or a multilayer circuit board such as inorganic material substrate of Si, alumina, sapphire, mullite, glass, glass ceramics, ceramics-glass composite material, silica, SiC, AlN, BN, BeO, ZrO2, MgO, etc., resin board of epoxy/kevler compound material, epoxy/glass compound material, etc., enameled substrate, and the like. Further, it is also effective to use the substrate having therein a capacitor or a substrate in which a capacitor was formed on the surface in accordance with the necessity of the reduction of various noises or the like. Further, in the case of using the device installation structure of the invention, it is effective to supply a driving power source voltage which is unique to each of the integrated circuit devices of different materials through the wirings formed in the inner portion and/or on the surface of the substrate on which the LSI chips are directly installed and/or the large substrate on which the small substrate or the package structure on which the LSI chips were installed is installed.

The device installation structure of the invention can be used by using various cooling methods such as natural air cooling, forced air cooling, indirect liquid cooling, direct liquid cooling, etc. Where the high speed processing capability is particularly required and, accordingly, a heat generation amount is very large, it is effective to use a method whereby the device installation structure of the invention is dipped into a liquid coolant such as Freon, liquid nitrogen, or the like and used. On the other hand, in the case where the device installation structure of the invention is dipped into a liquid coolant of a very low temperature such as a liquid nitrogen or the like and used, particularly, it is preferable to use a device whose operating speed is higher at a low temperature than that at a room temperature, for example, a device such as CMOS of Si, B-CMOS, GaAs, HEMT, etc. as an integrated circuit device for the purpose of the improvement of the performances of a large computer and various kinds of electronic control units using the device installation structure of the invention. Further, as a material which is used to join, it is desirable to use a material whose characteristics are excellent even at low temperatures. For instance, as a solder material, it is preferable to select a solder of the indium system or the like which is soft even at low temperatures and not brittle.

Figure 1:
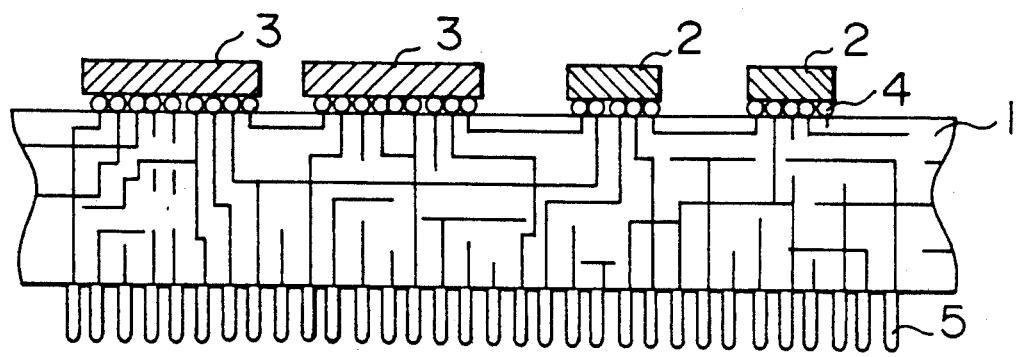
FIGS. 1 and 2 are cross sectional views showing examples of constructions of installation structures of integrated circuit devices of the invention in each of which two kinds of LSI chips were installed on the same substrate.

DESCRIPTION OF THE PREFERRED EMBODIMENTS (Embodiment 1)

LSI chips (thermal conductivity: 150 W/m.°K, thermal expansion coefficient: $26 \times 10^{-7}/°K$) made of Si in each Si semiconductor integrated circuit were such that the number of circuits formed per unit area was about 200 gates/mm$^2$ and the size was 5 mm □ (integration degree per chip: 5000 gates) were formed and LSI chips thermal conductivity: 58 W/m.°K, thermal expansion coefficient: $57 \times 10^{-7}/°K$). In each GaAs semiconductor integrated circuit devices the number circuits formed per unit area was about 100 gates/mm$^2$ and the size is set to 5 mm □ (integration degree: 2500 gates) with the LSI chips and GaAs circuit devices connected onto a glass ceramics multilayer wiring board (thermal expansion coefficient: $40 \times 10^{-7}/°K$) in which wirings of Cu were formed on the surface and in the inner portion, by the C4 method using solder bumps made of Pb-5% Sn each having a height of about 150 μm. On the other hand, as comparison examples, Si-LSI chips and GaAs-LSI chips having an integration degree set to 5000 gates and size of 5 mm □ were connected onto the glass ceramics multilayer wiring board by the similar method. The maximum distance between bumps was equal to 6.3 mm in both of the Si-LSI chip and the GaAs-LSI chip.

The operation tests of the above LSIs in which the actual use conditions were simulated under the same indirect liquid cooling condition were executed by using the above installation structures. Junction temperature distributions (temperature variations) in the chips and the average temperatures of the devices in the stationary state were measured. If the numbers of circuits formed per unit area in the comparison examples are the same, it has been found that a larger temperature distribution (temperature variation) occurred in GaAs device having the smaller thermal conductivity than that of the Si device. On the other hand, in the installation structure in which the integration degree of the GaAs devices was smaller than that of the Si devices in the embodiment, it has been confirmed that the temperature distribution in the GaAs device was fairly reduced. Further, in the comparison examples, the average temperature of GaAs device in the stationary state was higher than that of the Si device. In the embodiment, however, the average temperatures of both of the Si device and the GaAs device in the stationary state were almost the same temperature.

The difference of the thermal conductivities between the Si device and the GaAs device in the embodiment 5 was equal to 92 W/m.°K and the difference of the numbers of circuits was equal to 100 gates/mm$^2$. Therefore, the circuits of the number which is larger by about 1.1 gates/mm$^2$ per 1 W/m.°K corresponding to the about difference of the thermal conductivities was formed in the Si device.

In the embodiment, the ceramics multilayer substrate is further installed onto an organic multilayer circuit board and is connected to a platter through connectors and is three-dimensionally arranged and is used for a large computer or the like.

A forced air blast cooling method or a direct liquid cooling method can be used as a cooling method. In the embodiment, the logic device has been made of Si, the memory device has been made of GaAs, and the integration degree of the former device was larger than that of the latter device.

(Embodiment 2)

In the Si-LSI chips 2 of FIG. 1, the number of circuits formed per unit area was set to about 200 gates/mm$^2$ and the size was set to 7 mm □ (integration degree: 10000 gates) and, in GaAs-LSI chips 3, of the number of circuits formed per unit area was set to 100 gates/mm$^2$ and the size was set to 10 mm □ (integration degree: 10000 gates), with the Si-LSI chips 2 and GaAs-LSI chips 3 being connected onto an alumina multilayer wiring board 1 (thermal expansion coefficient: $55 \times 10^{-7}$/°K) in which conductive wirings were formed on the surface and in the inner portion by the C4 method using solder bumps 4 made of Pb-5% Sn each having a height of about 150 μm. I/O pins 5 are connected to the surface of the alumina multilayer wiring board 1 on the side where no LSI chip is connected. On the other hand, as comparison examples, Si-LSI chips and GaAs-LSI chips in each of which the chip size was set 7 mm □ and the number of circuits formed per unit area was set to 200 gates/mm$^2$ were connected onto the alumina multilayer wiring board by the similar method. The maximum distance between bumps was equal to 9 mm in the case of the LSI chip of 7 mm □ and 13.5 mm in the case of the LSI chip of 10 mm □.

In embodiment 2, the difference of the chip sizes between the Si device and the GaAs device was equal to a 3 mm of the side length and the thermal expansion coefficient difference between the GaAs device of the larger size and the alumina board was equal to $2 \times 10^{-7}$/°K, and the thermal stresses of both of Si and GaAs chips can be remarkably reduced.

While the back surface of each LSI of the foregoing installation structure was in contact with the same indirect liquid cooling heat sink and was cooled, the operation tests of the LSIs were performed. In embodiment 2, in order to equalize the total numbers of gates per chip, the number of circuits per unit area of the GaAs device having the smaller thermal conductivity was smaller than that of the Si device and the chip size of the GaAs device was larger than that of the Si device, both of the temperature distribution (temperature variation) in the GaAs device and the average temperature differences between the GaAs device and the Si device in the stationary state could be reduced as compared with those in the case of the comparison examples in which the numbers of circuits per unit area of the GaAs device and the Si device were the same and the chip sizes of both of the GaAs and Si devices were the same. On the other hand, as compared with the embodiment 1, in the case where the numbers of circuits per unit area of the GaAs and Si devices were the same, it has also been confirmed that the temperature variation in the GaAs device of the larger device size was larger than that of the device of the smaller size.

In embodiment 2 as well, it is also possible to three-dimensionally install in a manner similar to embodiment 1.

On the other hand, in embodiment 2, the logic device was made of Si and the memory device was made of GaAs. However, a construction opposite to the above construction can be also embodied. The cooling operation can be also executed in a manner similar to the above.

(Embodiment 3)

In each of the Si-LSI chips the number of circuits formed per unit area was about 200 gates/mm$^2$ and the size was 7 mm □ (integration degree: 10000 gates), and in each GaAs-LSI chips the number of circuits formed per unit area was about 100 gates/mm$^2$ and the size was set to 5 mm □ (integration degree: 2500 gates) were connected onto a mullite multilayer wiring board (thermal expansion coefficient: $30 \times 10^{-7}$/°K) in which conductive wirings were formed on the surface and in the inner portion by the C4 method using solder bumps made of Pb-5% Sn each having a height of about 150 μm. On the other hand, as comparison examples, Si-LSI chips having a chip size of 7 mm □ and number of circuits formed per unit area of 200 gates/mm$^2$ and GaAs-LSI chips having chip size 7 mm □ and the number of circuits formed per unit area of 100 gates/mm$^2$ were connected onto the mullite multilayer wiring board by the similar method. The maximum distance between bumps was equal to 6.3 mm in the case of the LSI chip of 5 mm □ and 9 mm in the case of the LSI chip of 7 mm □.

In embodiment 3, the size difference between the Si device and the GaAs device was equal to a 2 mm for each side length, the difference of the thermal expansion coefficients between the Si device of the larger size and the mullite board was equal to $4 \times 10^{-7}$/°K, and the thermal stresses of those devices can be remarkably reduced.

While the back surface of each LSI in the installation structure contacted the same indirect cooling heat sink and was cooled, the operation tests of the LSIs were performed. In the embodiment in which the number of circuits per unit area of the GaAs device having the smaller thermal conductivity and the chip size were set to be smaller than those of the Si device, it has been found that the temperature distribution (temperature variation) in the GaAs device further decreased and could be reduced to a level near the temperature distribution of the Si device as compared with the comparison example in which only the number of circuits per unit area of the GaAs device was set to a smaller value than that of Si device.

The temperature cycle tests of the above installation structures were executed under the conditions of the temperatures within a range from $-55°$ C. to 150° C. and one cycle/h. After completion of about 300 cycles of this test, in the samples shown in the comparison examples, cracks due to the fatigue breakage were observed in the soldered portion in which the GaAs device of 7 mm □ was connected. On the other hand, the similar temperature cycle tests were simultaneously executed while performing the current supplying tests. As a result, it has been found that in the samples of the comparison examples, after completion of about 250 cycles, cracks occurred in the edge portion of the GaAs device of 7 mm □. On the other hand, in the installation structure of embodiment 3, it has been found that no defect such as crack or the like occurred in the solder joined portions and device itself even after completion of 1000 cycles and that the good installation structure could be realized even with respect to the point of the reliability of the terminal connection.

In addition, in embodiment 3, it is also possible to three-dimensionally install in a manner similar to embodiment 1.

(Embodiment 4)

Figure 2:
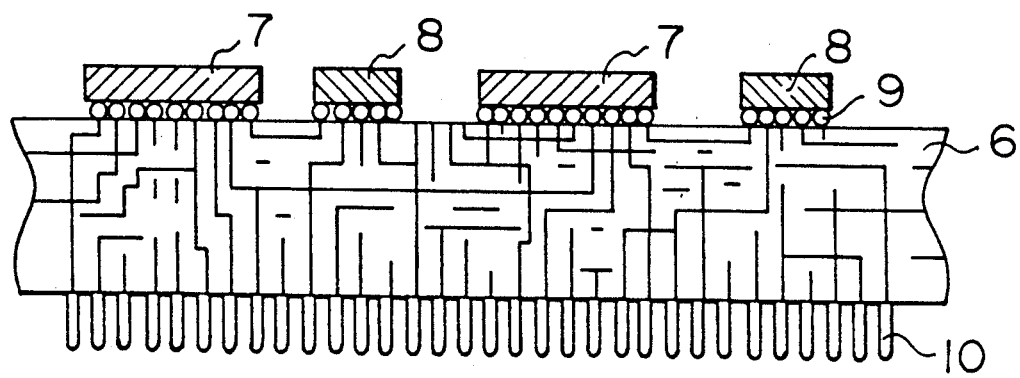
Figure 3:
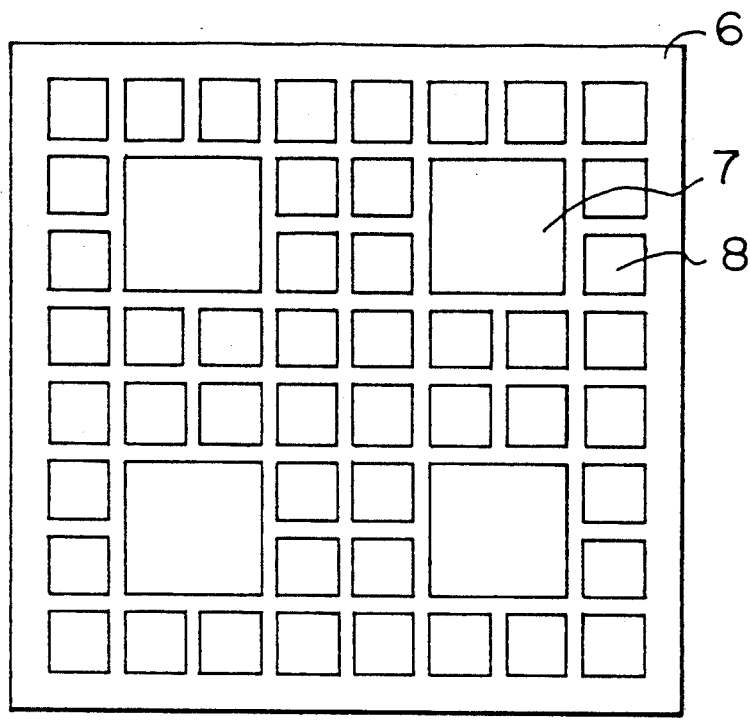
FIG. 3 is a plain view showing an example of a construction of an installation structure of integrated circuit devices of the invention in which two kinds of LSI chips were installed onto the same substrate.

In the Si-logic LSI chips 7 of FIGS. 2 and 3 the heat generation amount per unit area was 0.7 W/mm$^2$ and the size 10 mm □ and, in the GaAs-memory LSI chips 8 the heat generation amount per unit area was 0.3 W/mm$^2$ and the size was 7 mm □ with the Si-logic LSI chips 7 and the GaAs-memory LSI chips 8 being connected onto a glass ceramics multilayer wiring board 6 (thermal expansion coefficient: $35 \times 10^{-7}$/°K) in which conductive wirings were formed on the surface and in the inner portion by the C4 method using solder bumps 9 made of Pb-5% Sn each having a height of about 150 μm. The maximum distance between bumps was 9 mm with the LSI chip of 7 mm □ and 13.5 mm with the LSI chip of 10 mm □. On the other hand, I/O pins 10 connected to the surface of the glass ceramics multilayer wiring board 6 on the side where no LSI chip was connected. An arrangement on the flat plane of each LSI chip was such that a number of GaAs-memory LSI chips were disposed around the Si-logic LSI chip.

The difference of the thermal conductivities between Si and GaAs was equal to 92 W/m.°K, with the difference of the heat generation amounts of both of them being equal to 0.4 W/mm$^2$, and in embodiment 4, the heat generation amount of Si was higher than that of GaAs by only 0.004 W/mm$^2$ per 1 W/m.°K corresponding to the difference of the thermal conductivities. Consequently, the average temperature of both of the Si and GaAs devices can be almost equalized, and the local temperature increase can be eliminated, and therefore, the same cooling means can be used.

While the back surface of each LSI in the installation structure was in contact with the same indirect liquid cooling heat sink and cooled, the operation tests of the LSIs were executed. The temperature distribution (temperature variation) in the GaAs device having the smaller thermal conductivity and the average temperature differences in both of the Si and GaAs devices in the stationary states were so small so as to be levels of no practical problem.

In embodiment 4, the memory devices were regularly arranged around the logic device. As memories which are arranged around the logic device, there are a buffer memory of a high speed and a large capacity, a control memory, and a work memory of a large capacity. High processing speeds are required for all of those memories and at least one memory uses GaAs.

(Embodiment 5)

Figure 4:
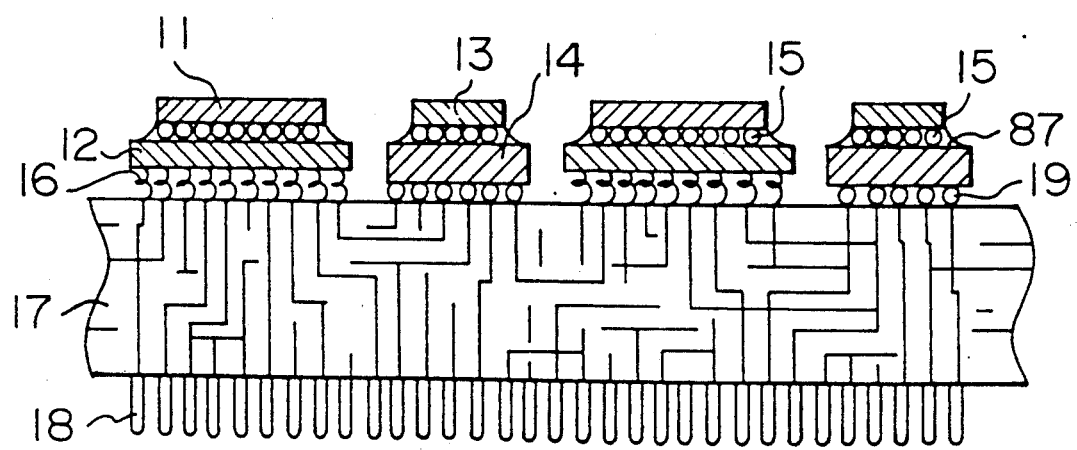
FIG. 4 is a cross sectional view showing an example of a construction of an installation structure of integrated circuit devices of the invention in which two kinds of LSI chips were installed onto the same large substrate through small substrate.

In the Si-LSI chip 11 of FIG. 4, the number of circuits formed per unit area was about 200 gates/mm$^2$ and the size was 10 mm □ (integration degree: 20000 gates) with the Si-LSI chip 11 being connected to a small mullite substrate 12 (thermal expansion coefficient: $30 \times 10^{-7}$/°K) in which the outer dimensions were 12 mm □ and conductive wirings were formed on the surface and/or in the inner portion by the C4 method using solder bumps 15 made of Pb-5% Sn each having a height of about 150 μm. A GaAs-LSI chip 13 in which the number of circuits formed per unit area was about 100 gates/mm$^2$ and the size was 7 mm □ (integration degree: 5000 gates) was connected onto a small alumina substrate 14 (thermal expansion coefficient: $55 \times 10^{-7}$/°K) in which the outer dimensions were 9 mm □ and conductive wirings were formed on the surface and/or in the inner portion by the C4 method using the solder bumps 15 in a manner similar to the Si-LSI chip 11. Further, to protect the semiconductor devices and to improve the solder connection reliability, an epoxy resin 87 was filled in the gap between the small substrate and the LSI chip. The epoxy resin 87 was formed by a compound of spherical silica fillers and rubber-like particles and its thermal expansion coefficient was close to the thermal expansion coefficient of the solder material made of Pb-5% Sn. The epoxy resin 87 was then thermally or optically hardened, thereby forming a package structure. Among the above small substrates, the substrate 12 of the size of 12 mm □ on which the Si-LSI chip 11 was connected onto a large glass ceramics multilayer wiring board 17 (thermal expansion coefficient: $40 \times 10^{-7}$/°K) by a lead method 16 made of micro coil springs (micro leads) each of which is made of metal and is formed by a few turns. On the other hand, I/O pins 18 are connected to the surface of the multilayer wiring board 17 on the side where no LSI chip is connected. On the other hand, the substrate 14 of the size of 9 mm □ on which the GaAs-LSI chip 13 had been installed was connected to the same large glass ceramics multilayer wiring board 17 by using solder balls 19 made of Pb-10% Sn. On the other hand, as a comparison example, an installation structure of integrated circuit devices has been constructed in substantially the same manner as embodiment 5 except that both of small substrates on which an Si-LSI chip was installed and small substrates on which a GaAs-LSI chip was installed were connected onto a large glass ceramics multilayer wiring board by the micro lead method. The maximum distance between bumps was equal to 9 mm in the case of the LSI chip of the size of 7 mm □ and 13.5 mm in the case of the LSI chip of 10 mm □ and 12 mm in the case of the small substrate of 9 mm □. The maximum distance between leads was equal to 12 mm for the small board of 9 mm □ and 15.5 mm for the small board of 12 mm □, respectively.

Cooling fins 85, 86 were connected to the back surface of each LSI of the installation structure and the operation tests of the LSIs were executed while forcedly cooling the whole installation structure. In the case of the comparison example where both of the small substrates installing Si and GaAs devices were connected to the large substrate by the micro lead method, the amount of generated heat from the LSIs removed from the board side through the micro lead is small because the leads are thin, and the heat is mainly removed from the back surfaces of the chips. Therefore, the temperature distribution (temperature variation) in the GaAs device having the smaller thermal conductivity was larger than that of the Si device and the operation of the GaAs device did not become stable. On the other hand, in embodiment 5, the small substrate on which the GaAs-LSI chip was installed was connected onto the large substrate by solder bumps made of Pb- 10% Sn having better heat transfer characteristics than those of the micro leads. Thus, a part of the heat generated in the GaAs device portion can be removed through the solder bumps, so that the temperature distribution (temperature variation) in the GaAs device can be largely improved as compared with the comparison example. The stable operation of the GaAs-LSI could be assured.

In embodiment 5, the Si device having the larger chip size of 10 mm □ installed onto the smaller mullite substrate and the mullite substrate installed onto the glass substrate having thermal expansion coefficient of $40 \times 10^{-7}/°K$. The thermal expansion coefficient difference between the mullite substrate and the glass substrate is equal to $10 \times 10^{-7}/°K$. Those substrate have been joined by flexible micro leads 16. Thus, the difference α between them can be reduced.

(Embodiment 6)

Figure 5:
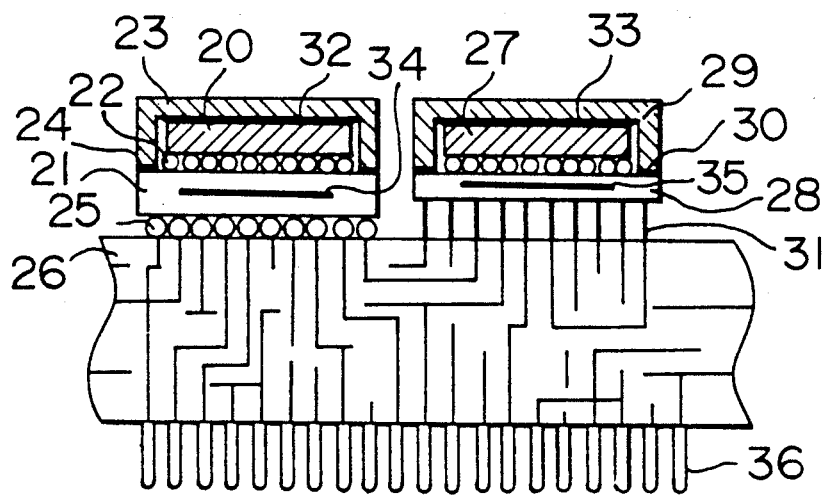
FIGS. 5 to 10 are cross sectional views showing examples of constructions of installation structures of integrated circuit devices of the invention in each of which two kinds of LSI chips were installed onto the same large substrate through small package structures.

In the Si-LSI chip 20 of FIG. 5 the number of per unit area was about 200 gates/mm² and the size was 10 mm □ (integration degree: 20000 gates) with the Si-LSI chip being connected onto a small glass ceramics substrate 21 (thermal expansion coefficient: 35 $10^{-7}/°K$) whose outer dimensions were 12 mm □ by the C4 method using solder bumps 22 made of Pb-5% Sn each having a height of about 150 μm. A cap 23 (thermal expansion coefficient: $37 \times 10^{-7}/°K$), made of SiC having high thermal conductivity, covered the Si-LSI chip 20 and a solder sealing 24 was performed, thereby obtaining a small package. The small package was connected onto a large glass ceramics multilayer wiring board 26 (thermal expansion coefficient: $35 \times 1010^{-7}/°K$) by the solder ball method using solders 25 made of Pb-10% Sn. On the other hand, in the GaAs-LSI chip 27, the number of circuits formed per unit area was about 100 gates/mm² and the size was 10 mm □ (integration degree: 10000 gates) with the GaAs-LSI chip 27 being connected onto a small glass ceramics substrate 28 (thermal expansion coefficient: $45 \times 10^{-7}/°K$) whose outer dimensions were set to 12 mm □ by the C4 method also using the solder bumps 22 made of Pb-5% Sn each having a height of about 150 μm. Further, a cap 29 (thermal expansion coefficient: $37 \times 10^{-7}/°K$), made of AlN (aluminum nitride), covered the GaAs-LSI chip 27 and a solder sealing 30 was performed, thereby forming a small package. The package structure was connected onto the large glass ceramics multilayer wiring board 26 by a pin method 31. However, the inner surfaces of the caps of the above package structures and the back surfaces of the Si-LSI chip 20 and GaAs-LSI chip 27 were fixed by solders 32 and 33, respectively. Conductive wirings and capacitors 34 and 35 were formed on the surfaces and/or the inner portions of the small glass ceramics substrates. I/O pins 36 were connected to the surface of the large glass ceramics multilayer wiring board 26 on the side where no LSI chip is connected. On the other hand, as comparison examples, an installation structure was formed by a similar method by using an Si-LSI chip and a GaAs-LSI chip in each of which the number of circuits formed per unit area was 200 gates/mm². The maximum distance between bumps was equal to 13.5 mm for the LSI chip of 10 mm □ and the maximum distance between solder balls or pins was equal to 15.5 mm for the small glass ceramics substrate of 12 mm □.

In embodiment 6, the difference between the thermal expansion coefficients between the board 28 on which the GaAs device is directly installed and the multilayer substrate on which the board 28 was installed was $10 \times 10^{-7}/°K$, and pin method was selected as the connection between the board 28 and the multilayer substrate. In the portion where such a thermal expansion coefficient difference is equal to or less than $9 \times 10^{-7}/°K$, a junction formed by the C4 method.

While the back surface of each of the small packages of the installation structure was in contact with the same indirect liquid cooling heat sink and cooled, the operation tests of the LSI, simulating actual use conditions, were executed. A junction temperature distribution (temperature variation) in each chip and an average temperature of each device in the stationary state were measured. When the numbers of circuits formed per unit area of the Si-LSI chip and GaAs-LSI chip of the comparison examples are the same, a larger temperature distribution (temperature variation) occurred in the GaAs device having the smaller thermal conductivity. On the other hand, in the case of the installation structure of the embodiment, it could be confirmed that the temperature distribution in the GaAs device was fairly reduced. Further, the average temperatures of both of the Si and GaAs devices in the stationary states were also almost the same in the embodiment 6 and the temperature variation in the large substrate area could be also reduced.

(Embodiment 7)

Figure 6:
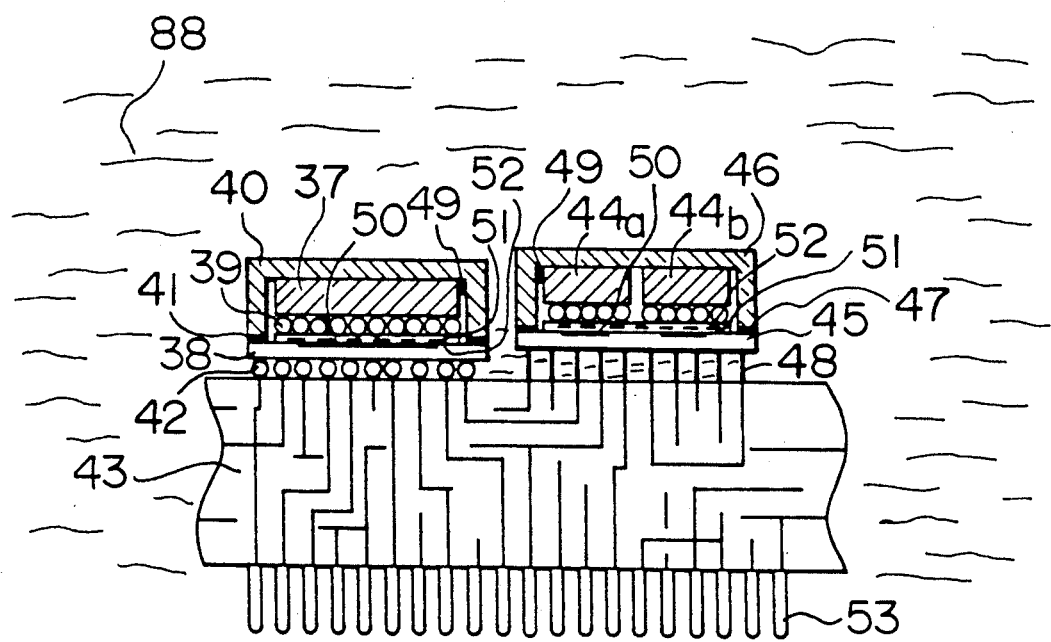

In the Si-CMOS LSI chip 37 of FIG. 6, the number of circuits formed per unit area was about 200 gates/mm² and the size was 15 mm □ (integration degree: 45000 gates) with the Si-CMOS LSI chip 37 being connected onto a small mullite substrate 38 (thermal expansion coefficient: $30 \times 10^{-7}/°K$) in which the outer dimensions were 17 mm □ and conductive wirings were formed on the surface and in the inner portion by the C4 method using solder bumps 39 made of In (indium) each having a height of about 150 μm. A cap 40, made of SiC having high thermal conductivity, covered the Si-CMOS LSI chip 37 and a solder sealing 41 was performed, thereby forming a small package. Further, the package was connected onto a large mullite multilayer wiring board 43 (thermal expansion coefficient: $30 \times 10^{-7}/°K$) by a solder ball method using solders 42 made of In-48% Sn. On the other hand, four GaAs-LSI chips 44a to 44d in each of which the number of circuits formed per unit area was about 100 gates/mm² and the size was 6 mm □ (integration degree: 4000 gates) were connected onto a small alumina substrate 45 (thermal expansion coefficient: $50 \times 10^{-7}/°K$) in which the outer dimensions were 17 mm □ and conductive wirings were formed on the surface and in the inner portion by the C4 method using also the solder bumps 39 made of In each having a height of about 150 μm. Further, a cap 46, made of AlN, covered the GaAs-LSI chips 44a to 44d and a solder sealing 47 was performed, thereby forming one small package. The package structure was connected onto the large mullite multilayer wiring board 43 by a pin method 48. The inner surfaces of the caps of the package structures and the back surfaces of the Si-LSI chip 37 and GaAs-LSI chips 44 are in contact with each other. Further, an He gas 49 was sealed in the package structures. On the other hand, conductive wirings and capacitors 50 are formed on the surfaces and/or in the inner portions of the small substrates. Further, thin film wiring layers 51 of a few layers and a resistor 52 are formed on the surface of each of the small substrates. I/O pins 53 are connected to the surface of the large mullite multilayer wiring board 43 on the side where no LSI chip is connected. The maximum distance between bumps was equal to 7.5 mm for the LSI chip of 6 mm □ and 20.5 mm for the LSI chip of 15 mm □. The maximum distance between solder balls or pins was equal to 23 mm for the small board of 17 mm □.

The above installation structure was dipped into a liquid nitrogen 88 which circulating and flowing. While the whole installation structure was cooled, the operation tests of the LSIs in simulated use conditions were executed. A junction temperature distribution (temperature variation) in each chip and an average temperature of each device in the stationary state were measured. Thus, the temperature distribution (temperature variation) in the GaAs device of the smaller thermal conductivity and the average temperature difference between both of the Si and GaAs devices in the stationary state were so small so as to no practical problem.

(Embodiment 8)

Figure 7:
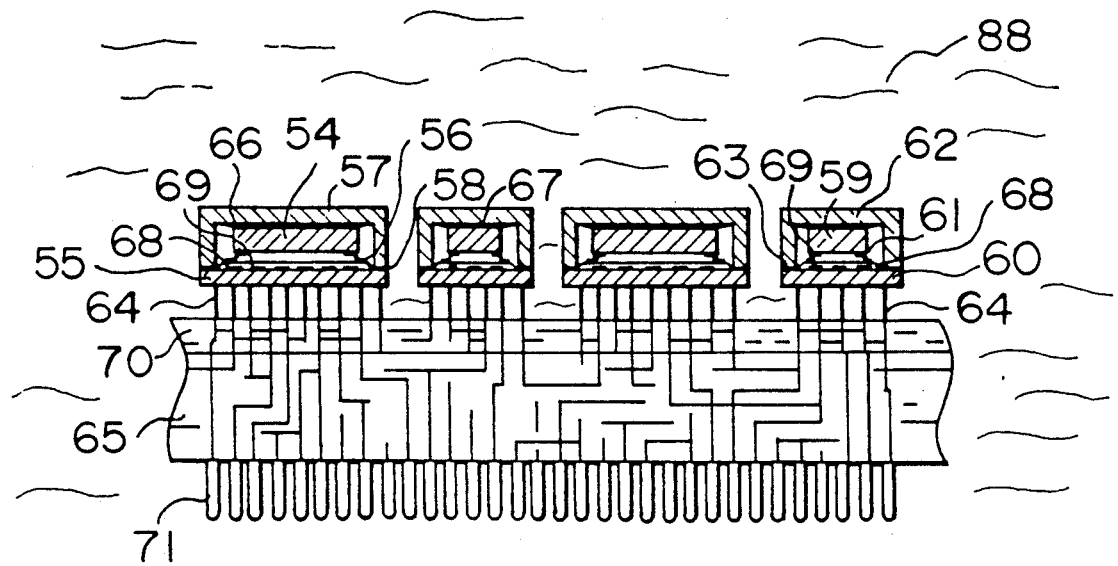

In the Si-LSI chip 54 of FIG. 7, the number of circuits formed per unit area was about 200 gates/mm$^2$ and the size was 15 mm □ (integration degree: 45000 gates) with the Si-LSI chip 54 being connected onto a small AlN substrate 55 (thermal expansion coefficient: $45 \times 10^{-7}/°K$) in which the outer dimensions were 17 mm □ and conductive wirings were formed on the surface and in the inner portion by a TAB method 56. A cap 57, made of AlN, covered the Si-LSI chip 54 and a solder sealing 58 was executed, thereby forming a small package. On the other hand, an HEMT-LSI chip 59 in which the number of circuits formed per unit area was about 100 gates/mm$^2$ and the size was 10 mm □ (integration degree: 10000 gates) was connected onto a small AlN substrate 60 in which the outer dimensions were 12 mm □ and conductive wirings were formed on the surface and in the inner portion by the TAB method 61 as well. Further, a cap 62, made of AlN, covered the HEMT-LSI chip 59 and a solder sealing 63 was performed, thereby forming a small package. The above packages were connected onto a large glass ceramics multilayer wiring board 65 (thermal expansion coefficient: $40 \times 10^{-7}/°K$) by a pin method 64. The inner surfaces of the caps of the package structures and the back surfaces of the Si-LSI chip 54 and HEMT-LSI chip 59 were fixed by solders 66 and 67, respectively. On the other hand, conductive wirings were formed on the surfaces and/or in the inner portions of the small substrates. Thin film wiring layers 68 of a few layers and a resistor 69 were further formed on the surfaces of the small substrates. Organic thin film multilayer wiring portions 70 of a few layers were formed on the upper surface of the large glass ceramics multilayer wiring board 65. On the other hand, I/O pins 71 were connected to the lower surface of the board 65 on the side where no LSI chip is connected. The maximum distance between pins was equal to 15.5 mm for the small substrate of 12 mm □ and 23 mm for the small substrate of 17 mm □.

The above installation structure was dipped into the liquid nitrogen 88 which was circulating and flowing While the whole installation structure was cooled, the operation tests of the LSIs, simulating actual use conditions, were executed. A junction temperature distribution (temperature variation) in each chip and an average temperature of each device in the stationary state were measured. Thus, the temperature distribution (temperature variation) in the GaAs device having the smaller thermal conductivity and the average temperature difference between the Si and GaAs devices in the stationary state were so small so as to cause no practical problem.

(Embodiment 9)

Figure 8:
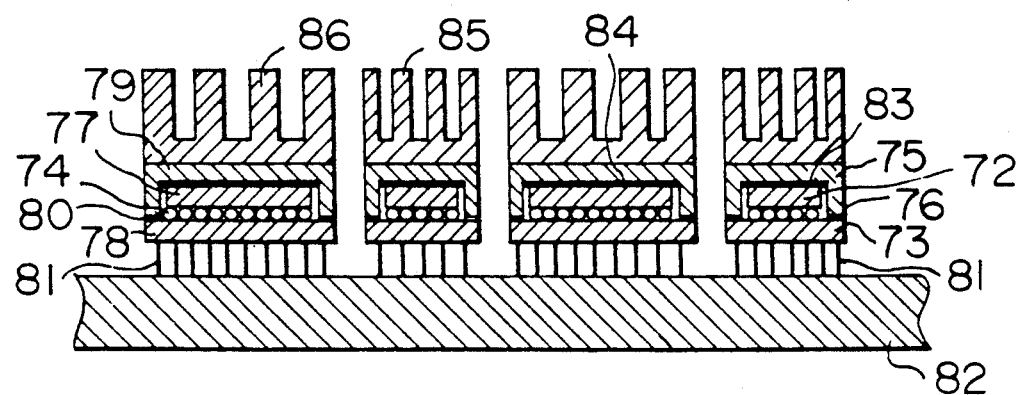

In the Si-LSI chip 72 of FIG. 8, the number of circuits formed per unit area was about 100 gates/mm$^2$ and the size was 5 mm □ (integration degree: 2500 gates), with the Si-LSI chip 72 being connected onto a small AlN (aluminum nitride) substrate 73 (thermal expansion coefficient: $45 \times 10^{-7}/°K$) in which the outer dimensions were 8 mm □, and conductive wirings were formed on the surface and in the inner portion by the C4 method using solder bumps 74 made of Pb-5% Sn each having a height of about 150 μm. A cap 75, made of AlN, covered the Si-LSI chip 72 and a solder sealing 76 was performed, thereby forming a small package. On the other hand, a GaAs-LSI chip 77 in which the number of circuits formed per unit area was about 50 gates/mm$^2$ and the size was 7 mm □ (integration degree: 2500 gates) was connected onto a small AlN substrate 78 in which the outer dimensions were 10 mm □, and conductive wirings were formed on the surface and in the inner portion by the C4 method using also the solder bumps 74 made of Pb-5% Sn each having a height of about 150 μm. Further, a cap 79, made of AlN, covered the GaAs-LSI chip 77 and a solder sealing 80 was performed, thereby forming a small package. The above package structures were connected onto a large glass fiber-epoxy compound multilayer wiring board 82 (thermal expansion coefficient: $65 \times 10^{-7}/°K$) by a pin method 81. The inner surfaces of the caps of the package structures and the back surfaces of the Si-LSI chip 72 and GaAs-LSI chip 77 were fixed by solders 83 and 84. The maximum distance between bumps was equal to 6.3 mm for the LSI chip of 5 mm □ and 9 mm for the LSI chip of 7 mm □. The maximum distance between leads was equal to 10 mm for the small board of 8 mm □ and 13 mm for the small board of 10 mm □.

Cooling fins 85 and 86 made of Al were connected to the back surface of each small package of the installation structure. While the whole installation structure was forcedly air cooled, the operation tests of the LSIs were executed. The temperature distribution (temperature variation) in the GaAs device having the smaller thermal conductivity and the average temperature difference of the Si and GaAs devices in the stationary state were so small so as to cause no practical problem.

(Embodiment 10)

Figure 9:
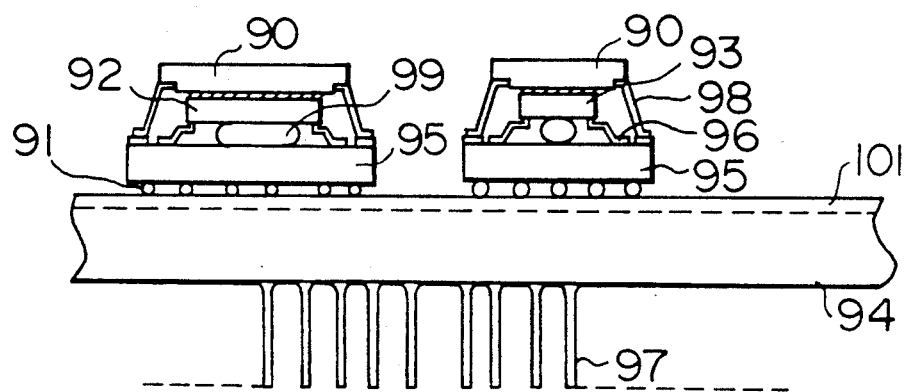

In a manner similar to the foregoing embodiments, in FIG. 9, an Si device 92 of a size of 10 mm □ and a GaAs device 93 of a size of 7 mm □ were metal joined to the heat sink 90 of sintered AlN or an CuW alloy and installed them onto small alumina substrates 95 by TAB method 96. High thermal conductive compound 99 like silicone rubber, etc., was inserted between alumina substrate and LSI device. A sealing was performed by using metal caps 98, thereby forming small packages. These packages were connected to a alumina multilayer substrate 94 by a C4 connection 91. The alumina multilayer substrate 94 comprises five or more polyimide multilayer thin films (Cu, Au thin film wirings) 101. The other construction of this embodiment is substantially the same as the embodiment 4.

Figure 10:
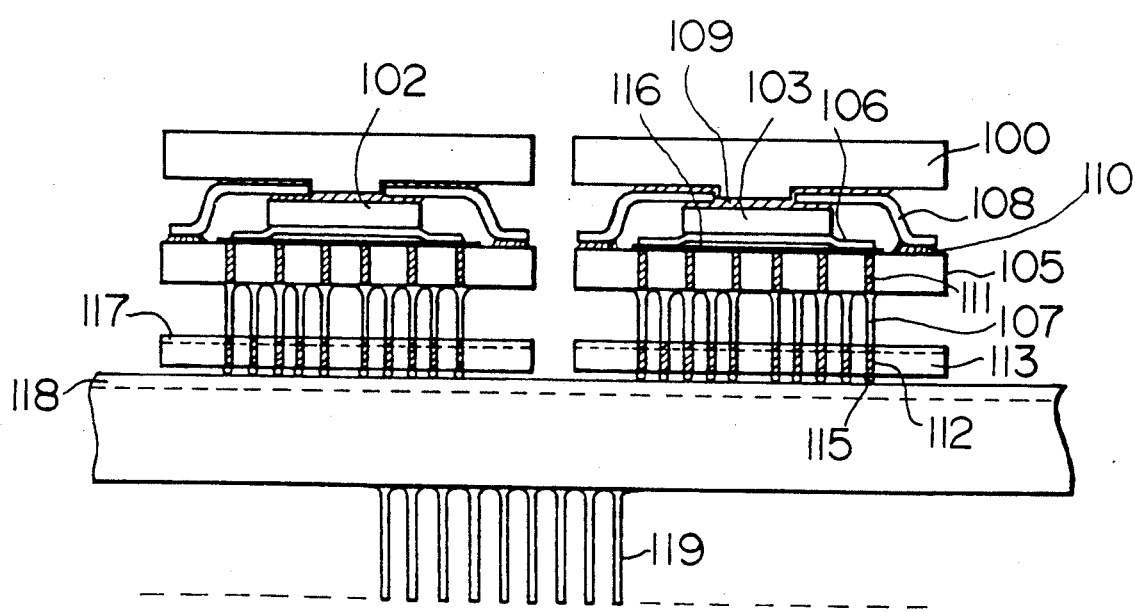

In FIG. 10, an Si device 102 and a GaAs device 103 each having a size of 10 mm □ are respectively metal joined to a heat sink 100 made of an AlN sintered material by solders 109 and are installed onto an AlN substrate 105 by a TAB method 106 and are sealed by a metal cap 108 using solders 110, thereby forming small packages. A through hole conductor 111 is provided for the AlN substrate 105 and pins 107 are connected to the surface of this substrate 105 on the opposite side of LSI chip. These packages were connected by solder balls 115 to an alumina glass composite multilayer substrate 104 with a Cu conductor through the glass ceramic buffer boards 113 in which through holes 112 were made. A polyimide thin film layer 116 having a metal wiring is formed on the AlN substrate 105. Similar polyimide layers with wiring 117, 118 are also formed on the glass ceramic buffer boards 113 and alumina/glass composite multilayer substrate 104. I/O pins 119 are connected to the surface of the multilayer substrate 104 on the opposite side of LSI chips. The other construction of the embodiment is substantially same as the embodiment 6.

According to the present invention, when various LSI chips of different materials are installed onto the same substrate and used or when they are installed onto the same large substrate through a small substrate or a package structure and used, there is no need to use any complicated or expensive cooling structure. Low temperature distribution (temperature variation) in each chip, the good heat balance of the whole module structure, and the like which are inevitable to construct an highly reliable installation structure of integrated circuit devices can be easily accomplished by a usual cooling method.

We claim:

1. An installation structure of integrated circuit devices comprising a plurality of integrated circuit devices of different base materials installed in parallel onto a substrate formed with wirings,
   wherein thermal conductivities of the different base materials are mutually different and a wiring density of the integrated circuit device made of the base material having a larger thermal conductivity is higher than a wiring density of the integrated circuit device made of the base material having a smaller conductivity.

2. An installation structure of integrated circuit devices comprising a plurality of integrated circuit devices of different base materials installed in parallel onto a substrate formed with wirings,
   wherein thermal conductivities of the different base materials are mutually different, and a heat generating amount per unit area of the integrated circuit device made of the base material having a larger thermal conductivity is larger than a heat generation amount per unit area of the integrated circuit device made of the base material having a smaller thermal conductivity.

3. An installation structure of integrated circuit devices comprising a plurality of integrated circuit devices of different base materials installed in parallel onto a substrate formed with wirings,
   wherein sizes of the integrated circuit devices are different,
   thermal expansion coefficients of the different base materials are mutually different, and
   a thermal expansion coefficient of the substrate is closer to a thermal expansion coefficient of the integrated circuit device having the largest size of all of the plurality of integrated circuit devices than a thermal expansion coefficient of the remaining integrated circuit devices of different base materials.

4. An installation structure of integrated circuit devices comprising a plurality of integrated circuit devices of different base materials installed in parallel onto a substrate formed with wirings,
   wherein sizes of the integrated circuit devices are different, thermal expansion coefficients of different base materials are mutually different, and wherein joining of the integrated circuit devices, to the substrate, a more mechanically flexible means is used for the integrated circuit device of a larger size than for the integrated circuit device of a smaller size for joining the integrated circuit devices to the substrate such that a stress in a joined portion can be reduced.

5. An installation structure of integrated circuit devices comprising a plurality of integrated circuit devices of different base materials installed in parallel onto a substrate formed with wirings,
   wherein thermal conductivities of the different base materials are mutually different thermal expansion coefficients of the different base materials are mutually different, and at least one of wiring densities, heat generation amounts per unit area, and sizes of the integrated circuit devices of different materials are different, and at least two of the following conditions (a) to (d) are satisfied:
   (a) a wiring density of the integrated circuit device made of the material having a larger thermal conductivity is higher than a wire density of the integrated circuit device made of the material having a smaller thermal conductivity,
   (b) a heat generation amount per unit area of the integrated circuit device made of the material having a larger thermal conductivity is larger than a heat generation amount per unit area of the integrated circuit device made of the material having a smaller thermal conductivity,
   (c) a thermal expansion coefficient of the substrate is closer to the thermal expansion coefficient of an integrated circuit device of the largest size in the whole integrated circuit device group than the thermal expansion coefficient of other integrated circuit device groups of different materials, and
   (d) with respect to joining of the integrated circuit devices to the substrate, a more mechanically flexible means is used for the integrated circuit device of a larger size than for the integrated circuit device of a smaller size such that a stress of the joined portion can be reduced.

6. An installation structure of integrated circuit devices comprising a plurality of integrated circuit devices of different base materials installed onto a small carrier substrate, and a plurality of small carrier substrates installed in parallel onto a large multilayer substrate,
   wherein thermal conductivities of the different base materials are mutually different,
   thermal expansion coefficients of the different base materials are mutually different, and at least one of wiring densities, heat generation amounts per unit area, and sizes of the integrated circuit devices of different base materials are different, and at least two of the following conditions (a) to (h) are satisfied:
   (a) a wiring density of the integrated circuit device made of the material having a larger thermal conductivity is higher than a wiring density of the integrated circuit device made of the material having a smaller thermal conductivity,
(b) a heat generation amount per unit area of the integrated circuit device made of the material having a larger thermal conductivity is larger than a heat generation amount per unit area of the integrated circuit device made of the material having a smaller thermal conductivity,
(c) a thermal expansion coefficient of the large multilayer substrate is closer to the thermal expansion coefficient of the integrated circuit device of the largest size in the whole integrated circuit device group than the thermal expansion coefficient of other integrated circuit device groups of different materials,
(d) a thermal expansion coefficient of the small carrier substrate is closer to the thermal expansion coefficient of the integrated circuit device of the largest size in the whole integrated circuit device group than the thermal expansion coefficient of other integrated circuit device groups of different materials,
(e) a thermal expansion coefficient of the large multilayer substrate is closer to the thermal expansion coefficient of the small carrier substrate of the largest size than the thermal expansion coefficient of the other carrier substrates of different materials,
(f) with respect to the junctions between the multilayer substrate and the small carrier substrates, a more mechanically flexible means is used for the carrier substrate carrying the integrated circuit device of a larger size than for the carrier substrate carrying the integrated circuit device of a smaller size so as to reduce a stress of the joined portion,
(g) with respect to the junctions between the carrier substrate and the integrated circuit devices, a more mechanically flexible means is used for the integrated circuit device of a larger size than for the integrated circuit device of a smaller size so as to reduce a stress of a joined portion, and
(h) with respect to the junctions between the multilayer substrate and the small carrier substrates, a more mechanically flexible means is used for the carrier substrate of a larger size than for the carrier substrate of a smaller size so as to reduce a stress of a joined portion.

7. An installation structure of integrated circuit devices comprising a logic device made of Si and a memory device made of GaAs installed in parallel onto a substrate formed with wirings,
wherein a size of the logic device is larger than a size of the memory device, and wherein
a thermal expansion coefficient of the substrate is closer to a thermal expansion coefficient of the Si logic device than a thermal expansion coefficient of the GaAs memory device.

8. An installation structure of integrated circuit devices comprising a plurality of packages of the integrated circuit devices of different base materials installed on a smaller carrier substrate and air-tightly sealed by caps and installed in parallel onto a multilayer substrate, and cooling means for directly cooling the packages and the multilayer substrate by a gas or liquid coolant,
wherein thermal conductivities of the different base materials are mutually different thermal expansion coefficients of the different base materials are mutually different and,
at least one of wiring densities, heat generation amounts per unit area, and sizes of the integrated circuit devices of the different base materials are different, and
at least one of the following conditions (a) to (h) is satisfied:
(a) a wiring density of the integrated circuit device made of the material having a larger thermal conductivity is higher than a wire density of the integrated circuit device made of the material having a smaller thermal conductivity,
(b) a heat generation amount per unit area of the integrated circuit device made of the material having a larger thermal conductivity is larger than a heat generation amount per unit of the integrated circuit device made of the material having a smaller thermal conductivity,
(c) a thermal expansion coefficient of the large multilayer substrate is closer to the thermal expansion coefficient of the integrated circuit device of the largest size in the whole integrated circuit device group than the thermal expansion coefficient of other integrated circuit device groups of different base materials,
(d) a thermal expansion coefficient of the small carrier substrate is closer to the thermal expansion coefficient of the integrated circuit device of the largest size in the whole integrated circuit device group than the thermal expansion coefficient of other integrated circuit device groups of different base materials,
(e) a thermal expansion coefficient of the larger multilayer substrate is closer to a thermal expansion coefficient of the small carrier substrate of the largest size than a thermal expansion coefficient of the other carrier substrates of different base materials,
(f) with respect to the junctions between the multilayer substrate and the small carrier substrates, a more mechanically flexible means is used for the carrier substrate carrying the integrated circuit device of a larger size than for the carrier substrate carrying the integrated circuit device of a smaller size,
(g) with respect to the junctions between the carrier substrate and the integrated circuit device, a more mechanically flexible means is used for the integrated circuit device of a larger size than for the integrated circuit device of a smaller size so that a stress of the joined portion can be reduced, and
(h) with respect to the junctions between the multilayer substrate and the small carrier substrates, a more mechanically flexible means is used for the carrier substrate of a larger size than for the carrier substrate of a smaller size so that a stress of the joined portion can be reduced.

9. An installation structure of integrated circuit devices comprising a logic device made of GaAs and a memory device made of Si installed in parallel onto a substrate formed with wirings,
wherein a size of the logic device is smaller than a size of the memory device, and wherein
a thermal expansion coefficient of the substrate is closer to a thermal expansion coefficient of the Si memory device than a thermal expansion coefficient of the GaAs logic device.

* * * * *